United States Patent [19]

Takeyama

[11] Patent Number: 5,338,940
[45] Date of Patent: Aug. 16, 1994

[54] APPARATUS FOR ION IMPLANTATION INCLUDING CONTACTLESS COOLING AND BEAM CURRENT MEASUREMENT MEANS

[75] Inventor: Kunihiko Takeyama, Kyoto, Japan

[73] Assignee: Nissin High Voltage Co., Ltd., Kyoto, Japan

[21] Appl. No.: 917,208

[22] Filed: Jul. 21, 1992

[30] Foreign Application Priority Data

Jul. 22, 1991 [JP] Japan ................. 3-204543
Jul. 22, 1991 [JP] Japan ................. 3-204544

[51] Int. Cl.$^5$ ................ H01J 37/30; G21K 5/08
[52] U.S. Cl. ............... 250/492.2; 250/492.21; 250/400
[58] Field of Search ........... 250/492.2, 492.21, 492.1, 250/397, 398, 400

[56] References Cited

U.S. PATENT DOCUMENTS

| | | | |
|---|---|---|---|
| 4,234,797 | 11/1980 | Ryding | 250/492.2 |
| 4,383,178 | 5/1983 | Shibata et al. | 250/441.1 |
| 4,599,516 | 7/1986 | Taya et al. | 250/492.21 |
| 4,831,270 | 5/1989 | Weisenberger | 250/492.21 |
| 4,904,902 | 2/1990 | Tamai et al. | 250/492.21 |
| 5,084,624 | 1/1992 | Lamure et al. | 250/492.21 |
| 5,148,034 | 9/1992 | Koike | 250/492.21 |

*Primary Examiner*—Jack I. Berman
*Assistant Examiner*—James Beyer
*Attorney, Agent, or Firm*—Finnegan, Henderson, Farabow, Garrett & Dunner

[57] ABSTRACT

Wafer disk holds wafers in position by centrifugal force and its rotating shaft is supported by a bearing capable of magnetic levitation that has a thrust bearing and radial bearings. An annular groove providing a heat radiating zone is formed under the wafer receiving faces of the wafer disk. A cooling plate cooled to a temperature not exceeding the temperature of liquid nitrogen is inserted into the groove in a contactless manner so that the wafer disk is cooled by heat radiation. In the absence of any area of physical contact in the mechanisms for axially supporting and cooling the wafer disk, ions can be implanted in low dose into wafers on the fast rotating disk while improving the quality of wafers after implantation. Further, no triboelectricity will develop, thereby contributing to an improvement in the precision of ion beam current measurement.

16 Claims, 6 Drawing Sheets

5,338,940

APPARATUS FOR ION IMPLANTATION INCLUDING CONTACTLESS COOLING AND BEAM CURRENT MEASUREMENT MEANS

BACKGROUND OF THE INVENTION

The present invention relates to an apparatus for ion implantation that is improved in the mechanism for supporting and cooling wafer disks.

FIG. 1 shows a cross section of a wafer disk with its support that is to be mounted in a conventional apparatus for implanting ions into semiconductor wafers by a batch process and which is equipped with a cooling means that employs a coolant. The periphery of the wafer disk 1 is inclined to form part of a conical surface and a plurality of recesses are formed in that peripheral portion, with the bottom of each recess proving a circular face 3 for receiving a wafer 2. The rotating shaft 4 of the wafer disk 1 is supported axially by a bearing 5 which, in turn, is fitted on a tubular member 6. As the wafer disk 1 rotates at ion implantation, the wafers 2 are held in intimate contact with the associated faces 3 by centrifugal force while an ion beam strikes the wafer disk 1 in a predetermined direction to implant ions into every part of each wafer by rotating the disk 1 and scanning it in the direction of arrow a. In order to prevent the wafers from becoming hot during ion implantation, a passage 7 for coolant is provided in the wafer disk 1, and coolant supply channels 8 and discharge channels 9 that communicate with the passage 7 are connected to a coolant supply source (not shown) via a bearing and coolant introducing rotary seal mechanism 12 having annular channels 10 and O-ring seals 11 provided for the tubular member 6, so that a coolant is supplied through the passage 7 to cool the wafer disk 1.

As described above, the rotating shaft 4 of the wafer disk 1 is supported axially by the bearing 5. Since this bearing mode involves mechanical contact, it requires periodic maintenance (parts replacement) and is not applicable to the case where the wafer disk 1 must be rotated at a speed higher than a certain level. This is also true with a mode of cooling the wafer disk using a fluid introducing rotary seal mechanism which similarly has a mechanical contact area. In addition, with the recent demand for keeping the high quality wafers after ion implantation, a need has arisen to implant ions in a controlled accurate dose. To meet this need; an ion beam current, or the current that flows through the wafer disk 1 as a result of ion implantation is measured with an ammeter 13 that is connected between the tubular member 6 of the bearing and fluid introducing rotary seal mechanism 12 and the ground (one end of the power supply for an ion beam generator not shown is grounded). However, triboelectricity will develop as a result of contact with the bearing mechanism and the current due to the charge buildup will also flow into the ammeter 13. If the ion beam current is on the order exceeding mA (milliamperes), the current due to the triboelectricity can be neglected. However, with a high-energy beam such as an ion beam under an acceleration voltage on the order of MV (megavolts), the amount of ion current flowing will not exceed about 100 $\mu$A and the current due to the triboelectricity is large enough to become a current noise for the ion beam current of interest, lowering the precision of measurement of a small beam current that flows as a result of low-dose ion implantation. The triboelectricity under consideration also develops by the flow of the coolant fluid which is used to cool the wafer disk 1 and by the contact thereof with a certain component in the fluid introducing rotary seal mechanism, and irrespective of its origin, the triboelectricity lowers the precision of measurement of the ion beam current.

FIG. 2 shows a cross section of a wafer disk that is to be mounted in another conventional apparatus for implanting ions into semiconductor wafers by a batch process and which is equipped with a cooling means that employs a coolant, in which the same reference numerals as those in FIG. 1 denote the same or like parts. This apparatus is substantially the same as that shown in FIG. 1 except that a wafer disk 1 is formed as a flat plate and wafers 2 are to be retained on receiving faces 3 that are defined by the bottom surfaces of inclined recesses formed in the periphery of the disk 1. Thus, detailed description of this apparatus will be omitted.

SUMMARY OF THE INVENTION

An object, therefore, of the present invention is to provide an apparatus for ion implantation in which a wafer disk is suspended by magnetism during a batch process and the wafer disk is cooled in a contactless manner, and which is also improved in the method of measuring an ion beam current, thereby solving all the problems associated with the prior art.

Another object of the present invention is to provide an ion implantation apparatus comprising an electron shower device that not only permits an ion beam current to be measured in a contactless manner but also prevents the wafer disk from being charged up.

The first object of the present invention can generally be attained by an apparatus for ion implantation that has a bearing means capable of magnetic levitation of a wafer disk and a means of cooling the wafer disk by heat radiation.

The second object of the present invention can be attained by an ion implantation apparatus comprising an electron shower device that has a filament for emitting electrons toward that area of a wafer disk in an apparatus for ion implantation which is to be irradiated with an ion beam, and an electrode container that covers a peripheral portion of the wafer disk.

The wafer disk is supported by the bearing means that is capable of magnetic leviation and that has no part making mechanical contact; at the same time, the disk is cooled by heat radiation. Hence, the wafer disk can be rotated at a faster speed while permitting ions to be implanted uniformly in low dose into all wafers on the disk. The electron emitting filament in the electron shower device provides the wafer disk with electrons that cancel the charges imparted by ions that are applied to the disk. Hence, the ion beam current can be measured in a contactless manner while preventing the wafer disk from being charged up.

DETAILED DESCRIPTION OF THE PREFERRED EMBODIMENTS

Figure 1:
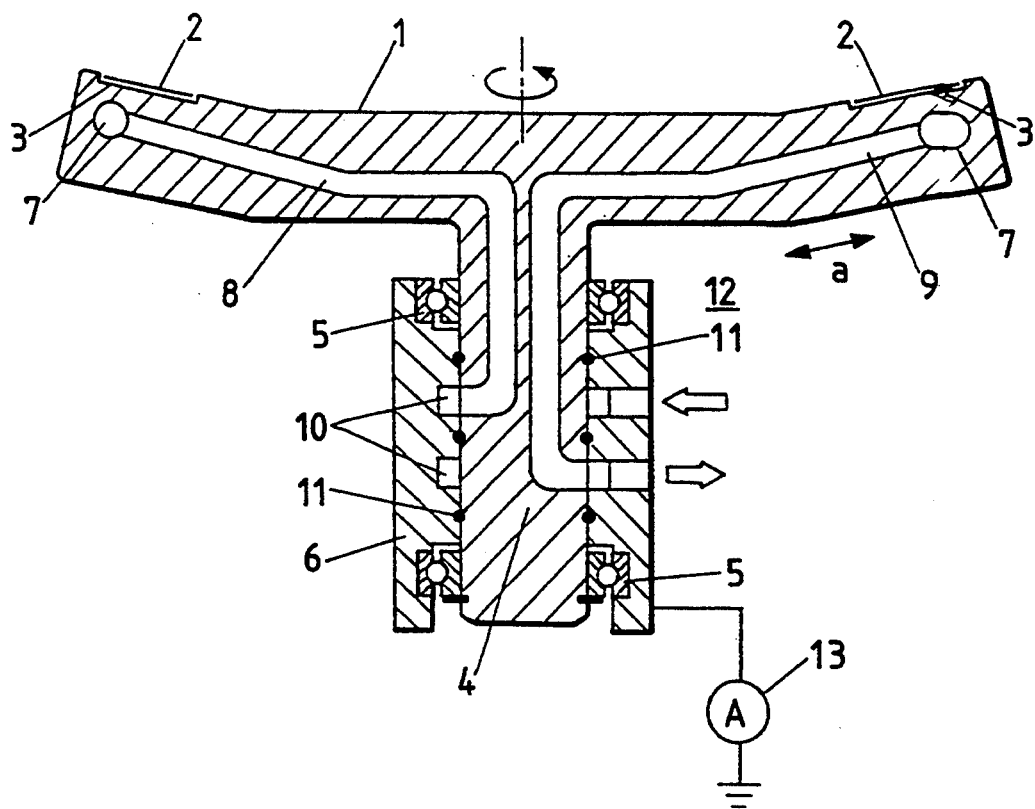
FIG. 1 is a cross section of a prior art apparatus for ion implantation.
Figure 2:
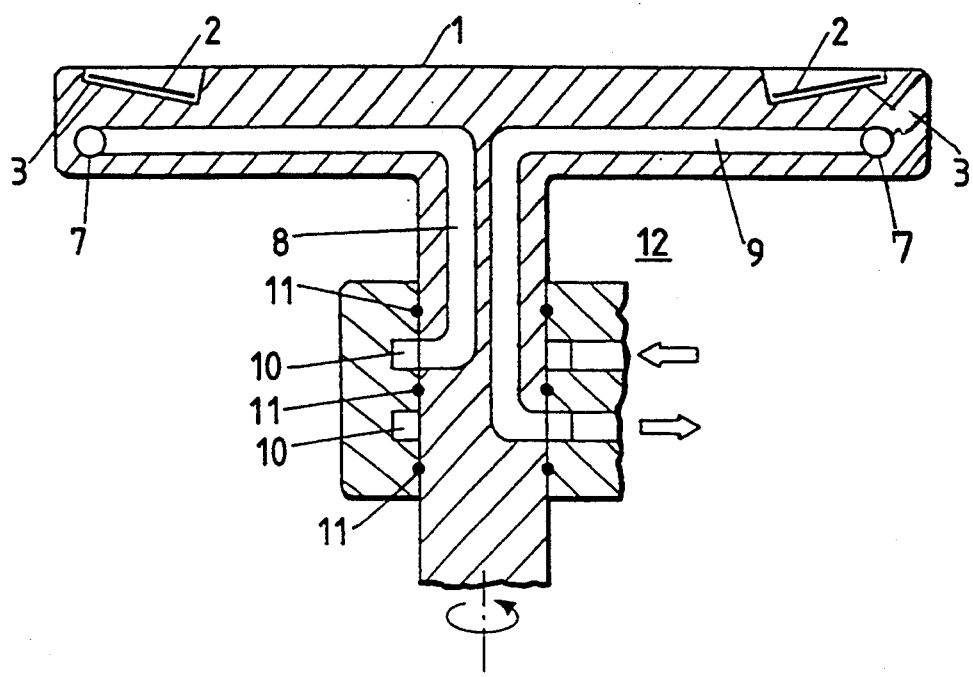
FIG. 2 is a cross section of another prior art apparatus for ion implantation.
Figure 3:
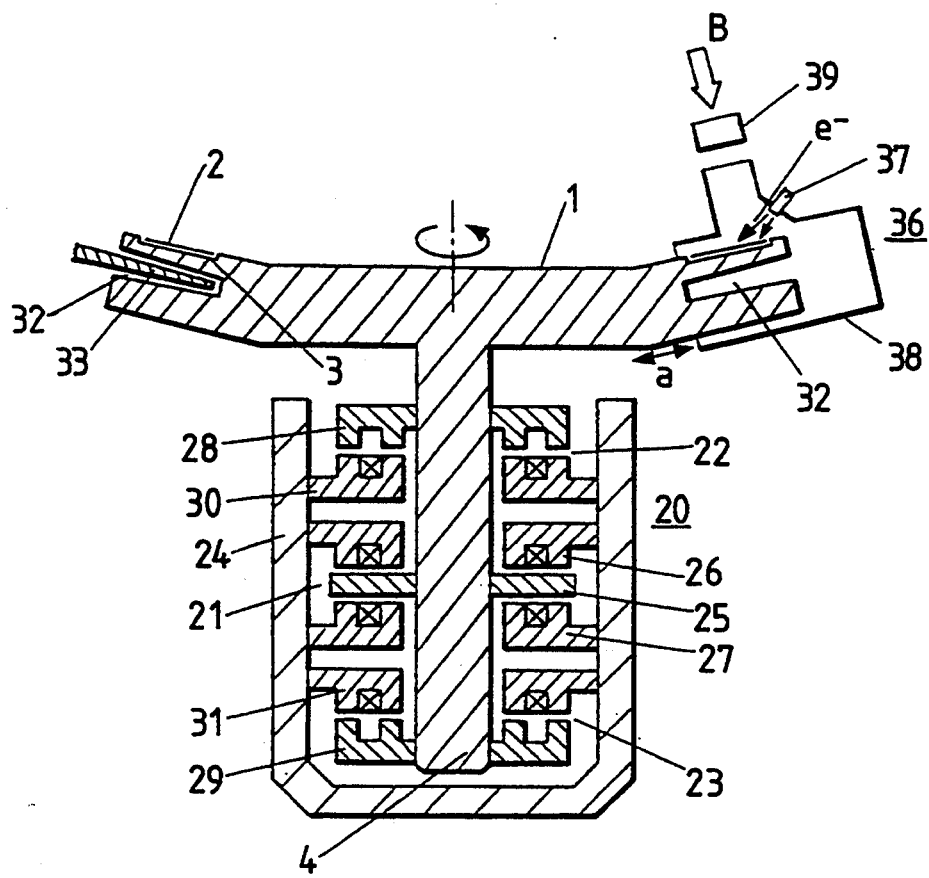
FIG. 3 is a cross section of an apparatus according to an embodiment of the present invention.

Preferred embodiments of the present invention will be described below with reference to FIGS. 3 to 12. In those figures, as well as FIGS. 1 and 2 which show prior art wafer disks for ion implantation and its support, same numerals identify similar or equivalent parts. FIG. 3 is a cross section of a wafer disk in an embodiment of the present invention as it is cut through the center line. The rotating shaft 4 of the wafer disk 1 is supported by a bearing 20 capable of magnetic levitation. The bearing 20 has a thrust bearing 21, a pair of radial bearings 22 and 23, and a support frame 24. The thrust bearing 21 comprises a rotating magnetic element 25 secured to the rotating shaft 4 and a pair of fixed magnetic poles 26 and 27 that face the magnetic element 25 and which are secured to the support frame 24, with an electromagnetic coil being provided for each fixed magnet. The radial bearing 22 is composed of a rotating magnetic pole 28 secured to the rotating shaft 4 and a fixed magnetic pole 30 secured to the support frame 24; the radial bearing 23 is composed of a rotating magnetic pole 29 secured to the rotating shaft 4 and a fixed magnetic pole 31 secured to the support frame 24. The pair of radial bearings 22 and 23 serve to prevent the tilting of the rotating shaft 4 and the magnetic poles in each bearing can be composed of permanent magnets and the thrust can be controlled by regulating the current flowing through the electromagnetic coils on the fixed magnetic poles 26 and 27 in the thrust bearing 21 (for more information on the bearing capable of magnetic levitation, see "Linear Motors and Their Applications", published by The Institute of Electrical Engineers of Japan, Mar. 30, 1984, pp. 198 to 201).

Figure 4:
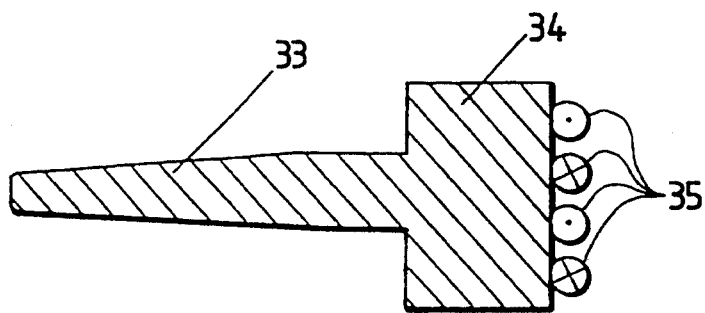
FIG. 4 illustrates a method of cooling the cryogenic cooling plate in the apparatus.

As shown in FIG. 3, an annular groove 32 is formed in the wafer disk 1 in such a depth that it extends from the peripheral side of the disk to cover the entire part of the bottom of each wafer receiving face 3; this annular groove 32 provides the heat dissipating zone of the wafer disk 1. A cooling plate 33 is inserted into the groove 32; the inner surfaces of the groove 32 face but do not contact the outer surfaces of the cooling plate 33. The cooling plate 33 is cooled to a temperature not higher than about the temperature of liquid nitrogen (77K) by means of either a helium cooler which relies upon the compression and expansion of helium or a cryogenic pump. Alternatively, as shown in FIG. 4, the plate 33 may be cooled by circulating, say, liquid nitrogen through pipes 35 welded to the base part 34 of the plate 33.

Heat on the wafer disk 1 is dissipated by radiation from the heat dissipating surface of the annular groove 32 and absorbed effectively by means of the cooling plate 33 in a cryogenic state. The temperature of the wafer disk 1 is about 300K whereas heat radiation takes place in the infrared region; hence, the groove 32 and cooling plate 33 in the wafer disk 1 are preferably subjected to a suitable surface treatment in order to enhance the thermal emissivity in the infrared region. For example, in the case where both inner surfaces of the groove 32 and the cooling plate 33 are made of aluminum; if aluminum is polished to a specular surface, its thermal emissivity is no more than 5% of the value for a perfect blackbody but it is increased to about 80% by oxidizing the aluminum electrolytically. The thermal emissivity of the inner surfaces of the groove 32 and the cooling plate 33 can also be enhanced by applying a black paint.

Figure 5:
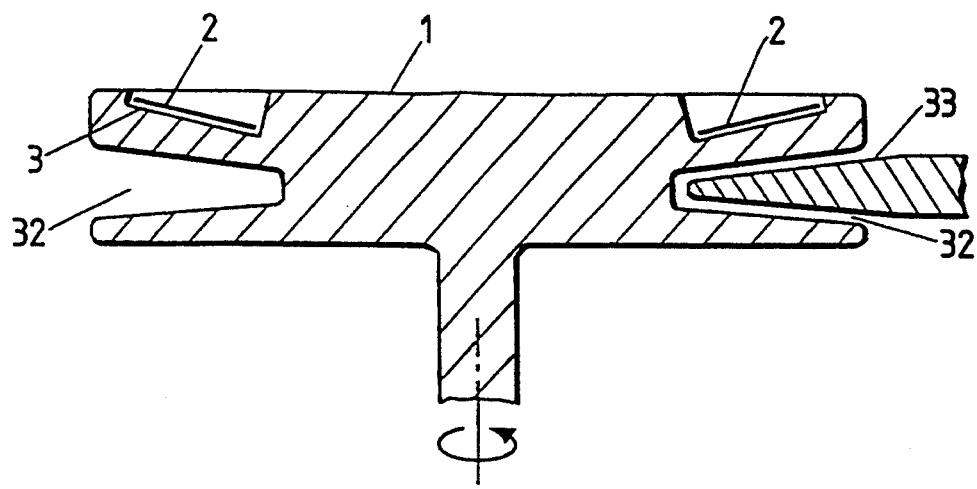
FIG. 5 is a cross section of a wafer disk in a cooling means according to another embodiment of the present invention.
Figure 6:
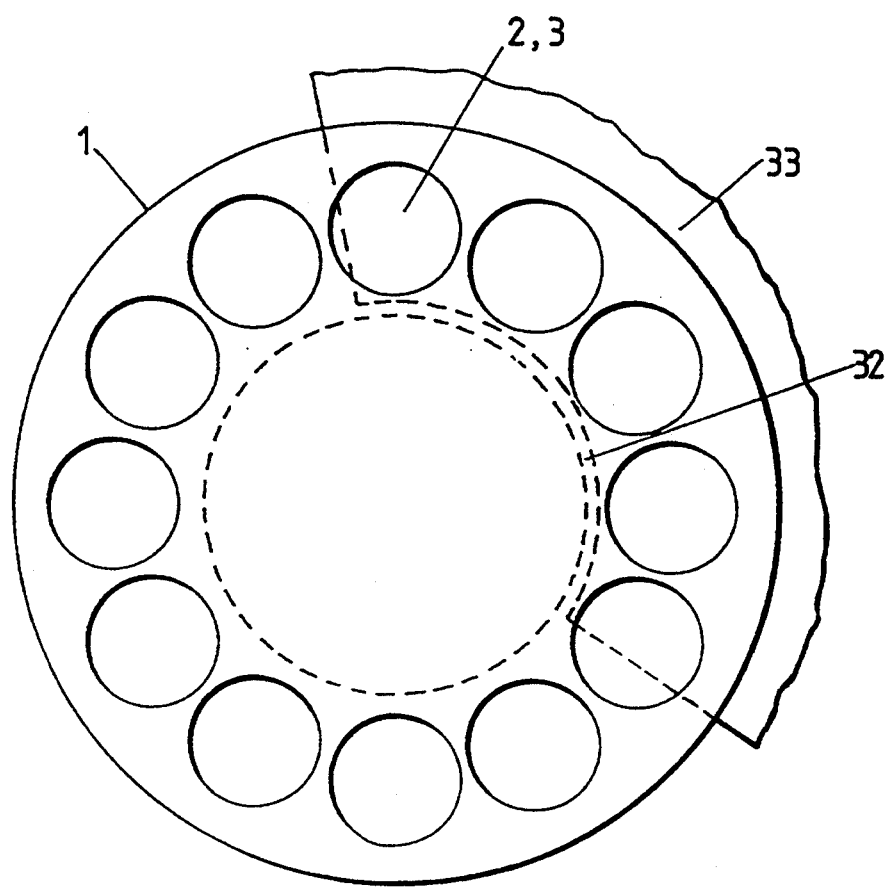
FIG. 6 is a top view of the wafer disk shown in FIG. 5.

FIG. 5 is a cross section of a wafer disk in another embodiment of the present invention as it is cut through the center line, and FIG. 6 is a top view of the disk. The wafer disk 1 is the same as the disk of FIG. 3 except that the wafer disk is formed as a flat plate and wafers 2 are to be retained on receiving faces 3 that are defined by the bottom surfaces of inclined recesses formed in the periphery of the disk 1. Thus, detailed description of this embodiment will be omitted.

Figure 7:
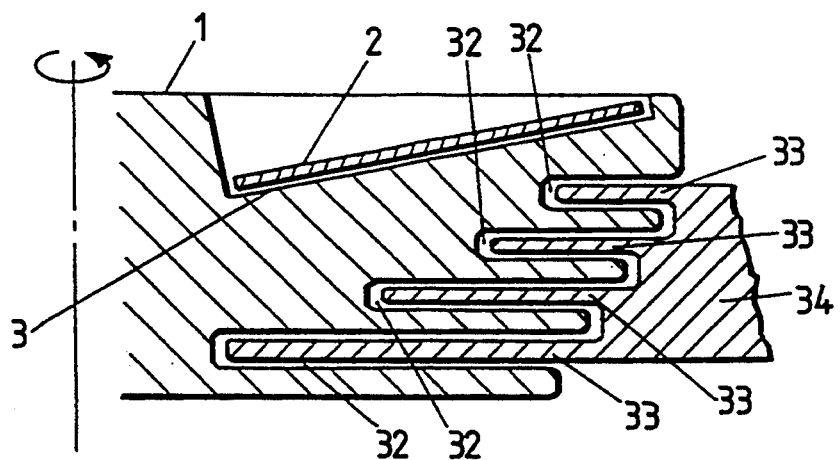
FIG. 7 is a cross section showing another embodiment of the present invention for cooling the wafer disk by heat radiation.

FIG. 7 shows an embodiment in which each of the annular groove 32 and the cooling plate 33 in the wafer disk 1 is formed in multiple layers, say, four layers, so as to increase the area of heat radiation. The wafer disk 1 is formed as a flat plate and wafers 2 are to be retained on receiving faces 3 that are provided by the bottom surfaces of inclined recesses formed in the periphery of the disk 1. As shown, four annular grooves 32 are formed in the wafer disk 1 and the corresponding number of cooling plates 33 that extend from a common base part 34 are inserted into the respective grooves. This arrangement is effective in further improving the ability to cool wafers.

Figure 8:
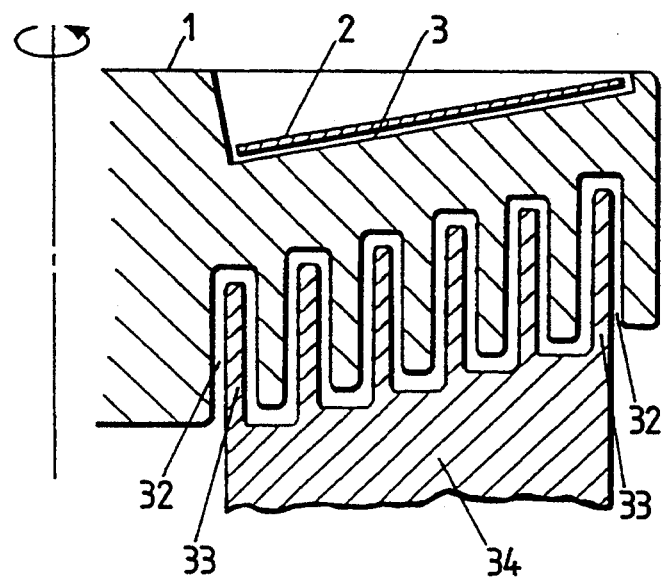
FIG. 8 is a cross section showing still another embodiment of the present invention for cooling the wafer disk by heat radiation.

FIG. 8 also shows the case where each of the annular groove 32 and the cooling plate 33 is formed in multiple layers but it differs from the case of FIG. 7 in that multiple, say, six grooves 32 and cooling plates 33 are disposed vertically to insure that each of the grooves and cooling plates is positioned appropriately relative to the wafers 2. Hence, in addition to the improvement or enhancement of the cooling performance due to the increased area of heat radiation, the embodiment shown in FIG. 8 enables uniform cooling of the wafers 2.

The Stefan-Boltzmann law states that the amount of heat radiation, W [W], from the wafer disk 1 is expressed by:

$$W = \sigma T^4 \epsilon S$$

where
- $\sigma$: Stefan-Boltzmann constant ($5.67/10^{12}$ [W/(cm$^2\cdot$K$^4$)])
- T: absolute temperature [K]
- $\epsilon$: thermal emissivity (ca. 0.8 for electrolytically oxidized aluminum)
- S: surface area [cm$^2$].

Hence, if the size of the cooling plate 33 is supposed to be 20 cm × 180 cm for both sides (equivalent to about nine 8-inch wafers); $S = 7.2 \times 10^3$ [cm$^2$].

If the surface temperature of the wafer disk, T, is 300K (27° C.) and assuming $\epsilon = 0.8$, the cooling performance is calculated as:

$$W = 260 \text{ [W]}.$$

If the multilayered structure shown in FIGS. 7 and 8 is adopted with each of the annular groove 32 and cooling plate 33 being formed in five layers, the cooling performance is increased to $W - 1300$ [W], which is comparable to the value attainable by the conventional method that cools the wafer disk with a coolant.

Figure 9:
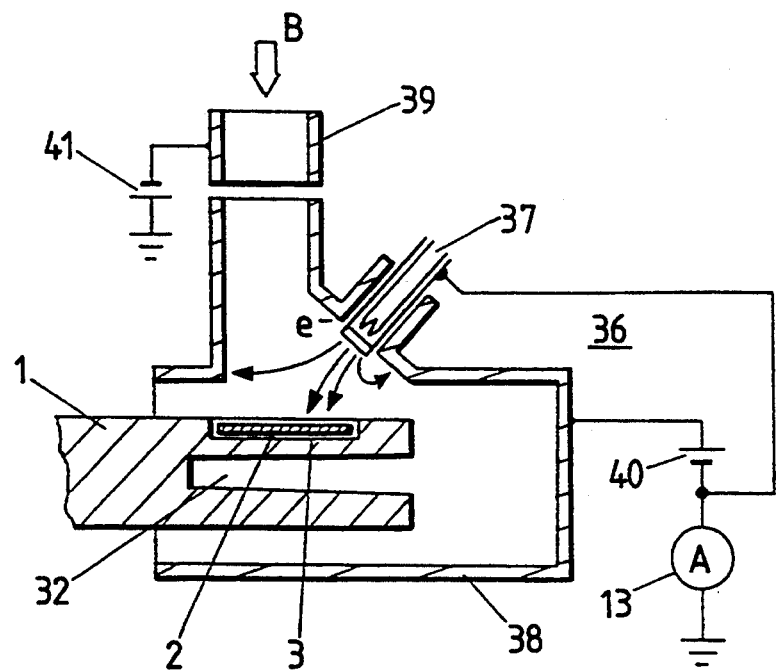
FIG. 9 is a schematic layout of a beam current measuring unit that operates on an electron shower device.

Turning back to FIG. 3, an electron shower device 36, which is a means of measuring the current of ion beam B, is provided in a location on the periphery of the wafer disk 1. FIG. 9 is an enlarged view of the area in which the device is located. As shown, the electron shower device 36 has an indirectly heated electron emitting filament 37, an electrode container 38 which covers the filament and the wafer disk 1, and an electron suppressor 39 which is disposed on top of the opening in the electrode container 38. The electrode container 38 is connected to a dc power supply 40, which holds the container 38 at a positive potential (no more than about 10 volts) with respect to the filament 37, with the junction between the power supply 40 and the filament 37 being grounded via an ammeter 13. Electrons emitted from the filament 37 will flow into the electrode container 38 while, at the same time, they will cancel out the positive charges that would otherwise build up on the wafer disk 1 to produce positive potential if an ion (positive ion) beam were applied to wafers 2 and the wafer disk 1. Stated more specifically, if the wafer disk 1 is positively charged, electrons will reach the disk whereas no electrons will reach there if the disk is negatively charged; hence, as many electrons as the charges of ions imparted to the wafer disk 1 will be imparted to the latter, whereupon a current will flow to the ground in an amount equal to the beam current, thereby making it possible to measure the beam current with the ammeter 13.

The electron suppressor 39 insures that electrons from the filament 37 and secondary electrons produced by the ion beam will not leak out of the electrode container 38 through the opening at the top. The suppressor 39 is biased negatively with respect to the electrode container 38 by means of a dc power supply 41. The indirectly heated filament 37 is used as the electron emitting filament in order to assure that the wafer disk is correctly held at the ground potential. If a directly heated filament is used, a potential difference will occur in the filament and the wafer disk cannot correctly be held at the ground potential.

Figure 10:
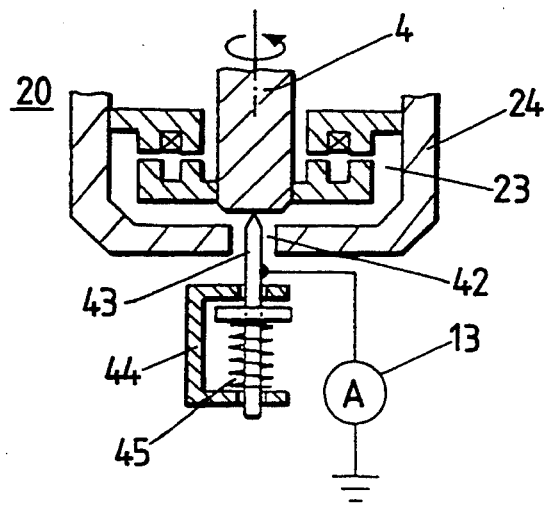
FIG. 10 is a schematic layout of a beam current measuring unit that uses a needle probe.

FIG. 10 shows another embodiment of the present invention which is an improvement of the method of measuring an ion beam current. An opening 42 is formed in the bottom of the support frame 24 of the bearing capable of magnetic levitation. A needle probe 43 is inserted through this opening to contact the bottom of the rotating shaft 4 of the wafer disk 1. The needle probe 43 is not only supported slidably by a support member 44 but also supplied with a contact pressure by a spring 45. An ammeter 13 is connected between the needle probe 43 and the ground for measuring the ion beam current which flows from the wafer disk 1 and the rotating shaft 4 to the ground upon irradiation of the wafers and the disk with an ion beam. Since the needle probe 43 contacts the rotating shaft 4 only at a point, it will neither produce triboelectricity nor interfere with the fast rotation of the wafer disk 1 that is achieved by the bearing 20 capable of magnetic levitation.

Figure 11:
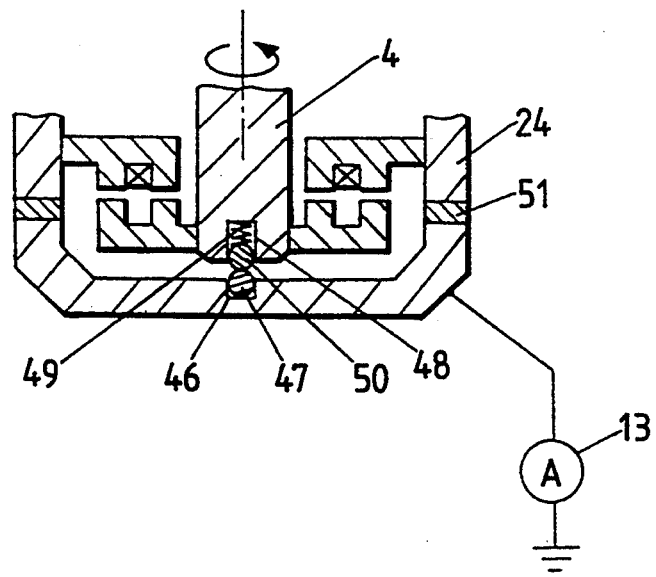
FIG. 11 is a schematic layout of a beam current measuring unit that uses spherical probes.

FIG. 11 shows still another embodiment of the present invention which is also an improvement of the method of measuring the ion beam current. A cavity 46 is formed in the bottom of the support frame 24 of the bearing 20 capable of magnetic levitation and a spherical probe 47 is provided in this cavity 46. At the same time, another cavity 48 is formed in the bottom of the rotating shaft 4 and a spherical probe 50 is provided in that cavity, with a compressive spring 49 being interposed. By means of point contact between the two spherical probes 47 and 50, the rotating shaft 4 is connected to the ground via an ammeter 13. As in the embodiment shown in FIG. 10, the only contact occurs at the point of interface between the two spherical probes 47 and 50, and this offers the advantage of neither producing triboelectricity nor interfering with the fast rotation of the wafer disk 1 that is achieved by the bearing 20 capable of magnetic levitation. In the embodiment under consideration, an insulator 51 is provided in the support frame 24 of the bearing 20 to insure that when the support frame is brought into a circuit connection to the ground, the areas associated with the spherical probes will be insulated from the grounded connection.

Figure 12:
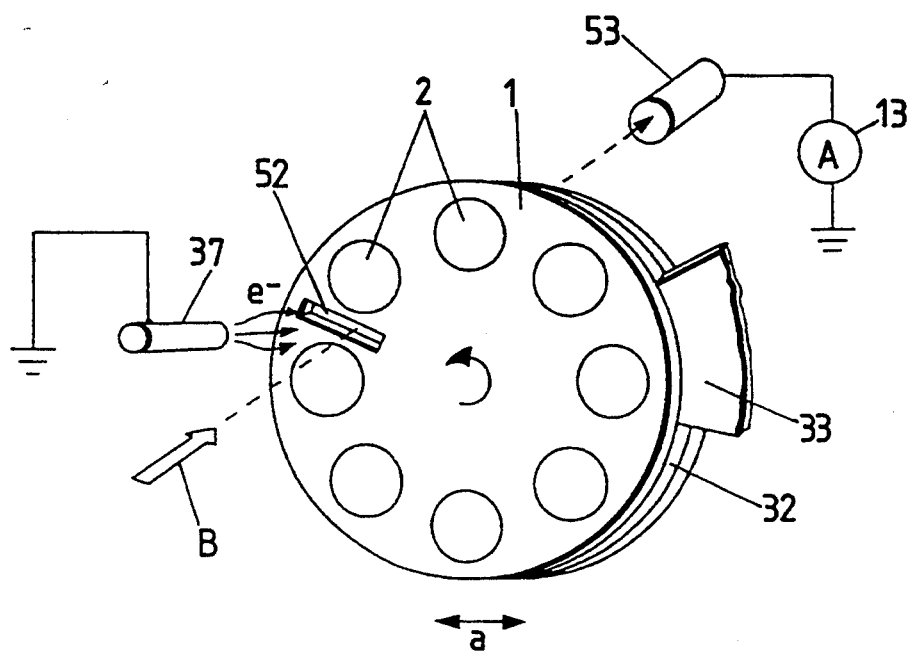
FIG. 12 is a schematic layout of a beam current measuring unit that operates on a slit monitor method.

FIG. 12 shows yet another embodiment of the present invention in which the ion beam current is measured with a slit being formed in the wafer disk. As shown, a slit 52 is formed in the wafer disk 1. An ion beam B passing through the slit is directed to a Faraday cup 53 and the output of that cup is measured with an ammeter 13. In this case, too, the beam current has to be carried to the outside of the wafer disk 1 (otherwise, the wafers 2 and the wafer disk 1 will be charged up), and the electron shower device shown in FIG. 9 is used as a means of meeting this need. Only the electron emitting filament 37 which is a component of the device 36 is shown in FIG. 12 and this filament supplies as many electrons as the charges of the ion beam, causing the beam current to flow to the ground point. The filament 37 need not be of an indirectly heated type but it may be of a directly heated type.

The beam current can be caused to flow toward the ground by means of either the needle probe 43 shown in FIG. 10 which contacts the rotating shaft 4 at a point or the two spherical probes 47 and 50 which are shown in FIG. 11. In either case, the probes are connected to the ground.

The apparatus of the present invention for implanting ions into wafers is constructed in the way described hereinabove. Since it has neither areas of mechanical contact nor wearing parts in the area that directly supports the wafer disk, the apparatus is maintenance-free and is capable of achieving faster rotation of the disk than the prior art system which has a mechanism for making physical contact while involving the circulation of a fluid. As a result, the apparatus is improved in the uniformity of ion implantation and the capability of low-dose implantation.

The wafer disk can dissipate heat by radiation without using a fluid introducing rotary seal mechanism of the type conventionally adopted to circulate a coolant through the interior of the disk and the only requirement to be satisfied is that the heat dissipating zone of the wafer disk be positioned to face cooling plate in a cryogenic state. This contributes to the great simplicity in the construction of the apparatus. In addition, the absence of triboelectricity permits the ion beam current to be measured accurately, yielding wafers of high quality after ion implantation.

By inserting the cryogenic cooling plate into the annular groove formed in the wafer disk, the heat radiating surface can be increased to insure its effective use. If each of the annular groove and the cooling plate is formed in multiple layers, the area of the heat radiating surface can be further increased to provide higher cooling performance.

If the annular groove and the cooling plate are positioned vertically with respect to the wafer disk, with each being formed in multiple layers, not only can the area of the heat radiating surface and the cooling performance be increased but also the wafers on the disk can be cooled uniformly.

The thermal emissivity of the inner surfaces of the annular groove and the outer surfaces of the cooling plate can be increased by subjecting them to electrolytic oxidation or coating them with a black paint.

The rotating part of the apparatus which includes the wafer disk makes no contact at all with the stationary or fixed part and no fluid is introduced into the rotating part, hence, no triboelectricity will develop and the noise to the measurement of a small beam current is sufficiently reduced to improve the precision of measurement. The beam current can be measured in a contactless manner either by means of the electron shower device or by a slit monitor method. Even if contacting needle probes or spherical probes are to be used for measuring the beam current, the only contact that occurs is a point contact which requires no consideration of the possible effect of triboelectricity and this contributes to a marked improvement in the precision of measurement.

The slit monitor method is conventionally known to be capable of measuring the ion beam current without being affected by triboelectricity. However, in the presence of only one slit in the wafer disk, the rate of measurement is such that one pulse of beam current is picked up per revolution of the disk and, hence, approximately one hundredth of the ion beam current that is flowing can be detected, and although the noise (N) is small, the output signal (S) is also small. In contract, the system of the present invention, which uses an electron shower device, a needle probe or spherical probes, achieves a marked improvement in the S/N ratio of ion beam current measurement since this can be accomplished without sacrificing the intensity of output signal but with lowering only the deleterious noise.

What is claimed is:

1. An apparatus for ion implantation, comprising:
 a wafer disk having wafer receiving faces and a heat dissipating zone, a wafer being mounted on each of said wafer receiving faces; and
 cooling means separated from said wafer disk by said heat dissipating zone in a contactless manner for cooling said wafer disk through heat radiation.

2. The apparatus for ion implantation as claimed in claim 1, wherein said cooling means includes a cryogenic cooling plate disposed to face said heat dissipating zone.

3. The apparatus for ion implantation as claimed in claim 2, wherein said cryogenic cooling plate is inserted in an annular groove formed as said heat dissipating zone in said wafer disk.

4. The apparatus for ion implantation as claimed in claim 3, wherein each of said annular groove and said cryogenic cooling plate is formed in multiple layers.

5. The apparatus for ion implantation as claimed in claim 2, wherein surfaces of said wafer disk at said heat dissipating zone and said cryogenic cooling plate are oxidized electrolytically.

6. The apparatus for ion implantation as claimed in claim 3, wherein surfaces of said annular groove formed in said wafer disk and said cryogenic cooling plate are oxidized electrolytically.

7. The apparatus for ion implantation as claimed in claim 4, wherein surfaces of said annular groove formed in multiple layers and said cryogenic cooling plate formed in multiple layers are oxidized electrolytically.

8. An apparatus for ion implantation comprising:
 a wafer disk having wafer receiving faces, a wafer being mounted on each of said wafer receiving faces;
 a cooling means for cooling said wafer disk through heat radiation; and
 a bearing means capable of magnetic levitation of said wafer disk.

9. The apparatus for ion implantation as claimed in claim 8, wherein said wafer disk is provided with a rotating shaft, said rotating shaft being supported by said bearing means in a contactless manner.

10. The apparatus for ion implantation as claimed in claim 9, further comprising a measuring means for measuring an ion beam current in a point-contact manner.

11. The apparatus for ion implantation as claimed in claim 10, wherein said measuring means includes a needle probe inserted through an opening of a support frame of said bearing means so as to contact a bottom of said rotating shaft, a support member for slidably supporting said needle probe, a spring for applying a contact pressure to said needle probe, and an ammeter connected between said needle probe and the ground.

12. The apparatus for ion implantation as claimed in claim 10, wherein said measuring means includes a spherical probe provided in a cavity formed in a bottom of a support frame of said bearing means, a spherical probe provided in a cavity formed in a bottom of said rotating shaft, a spring provided in said cavity of said rotating shaft to cause point contact between said two spherical probes, and an ammeter connected between said support frame and the ground.

13. An apparatus for ion implantation, comprising:
 a wafer disk having wafer receiving faces, a wafer being mounted on each of said wafer receiving faces;
 an electron shower device including a filament for emitting electrons toward an area of said wafer disk which is to be irradiated with an ion beam;
 an electrode container that covers a peripheral portion of said wafer disk in a contactless manner, said electrode container and said electron shower device being connected by a dc power supply; and
 an ammeter connected between said dc power supply and ground, whereby an ion beam current striking said wafer disk is determined by a current flowing from said electrode container and through said ammeter.

14. The apparatus for ion implantation as claimed in claim 2, wherein surfaces of said wafer disk at said heat dissipating zone and said cryogenic cooling plate are coated with a black paint.

15. The apparatus for ion implantation as claimed in claim 3, wherein surfaces of said annular groove formed in said wafer disk and said cryogenic cooling plate are coated with a black paint.

16. The apparatus for ion implantation as claimed in claim 4, wherein surfaces of said annular groove formed in multiple layers and said cryogenic cooling plate formed in multiple layers are coated with a black paint.

* * * * *